(12) United States Patent
Jiang et al.

(10) Patent No.: US 6,343,019 B1
(45) Date of Patent: *Jan. 29, 2002

(54) APPARATUS AND METHOD OF STACKING DIE ON A SUBSTRATE

(75) Inventors: Tongbi Jiang; Chad A. Cobbley, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/545,250

(22) Filed: Apr. 7, 2000

Related U.S. Application Data

(63) Continuation of application No. 08/995,377, filed on Dec. 22, 1997, now abandoned.

(51) Int. Cl.$^7$ ................................................ H05K 7/02
(52) U.S. Cl. .................. 361/761; 361/764; 361/723; 361/773; 361/760; 257/723; 257/724; 257/784; 174/52.1; 174/52.2; 174/52.4
(58) Field of Search ........................... 361/764, 761, 361/723, 773, 792, 760; 257/723, 784, 724, 700, 684; 174/52.1, 52.2, 52.4

(56) References Cited

U.S. PATENT DOCUMENTS

| | | | |
|---|---|---|---|
| 5,412,538 A | * 5/1995 | Kikinis et al. | 361/792 |
| 5,528,222 A | 6/1996 | Moskowitz et al. | 340/572 |
| 5,566,441 A | 10/1996 | Marsh et al. | 29/600 |
| 5,600,175 A | 2/1997 | Orthmann | 257/532 |
| 5,652,462 A | * 7/1997 | Matsunaga et al. | 257/686 |
| 5,661,339 A | * 8/1997 | Clayton | 257/678 |
| 5,682,143 A | 10/1997 | Brady et al. | 340/572 |
| 5,696,395 A | * 12/1997 | Tseng | 257/308 |
| 5,754,408 A | * 5/1998 | Derouiche | 361/773 |
| 5,818,698 A | * 10/1998 | Corisis | 361/760 |
| 5,875,100 A | * 2/1999 | Yamashita | 361/764 |
| 5,998,860 A | * 12/1999 | Chan et al. | 257/679 |

FOREIGN PATENT DOCUMENTS

| | | | |
|---|---|---|---|
| EP | 0 231 937 B1 | 8/1987 | G06K/19/077 |
| EP | 0 595 549 A2 | 5/1994 | H04Q/9/00 |

* cited by examiner

Primary Examiner—Leo P. Picard
Assistant Examiner—David Foster
(74) Attorney, Agent, or Firm—Dorsey & Whitney LLP

(57) ABSTRACT

An apparatus and method wherein an outer die is mounted on an inner die to form a stack which is mounted on a first surface of a substrate, such as a circuit board, the stack may be mounted filly or partially recessed in a recess which is formed in a first surface of the substrate which is dimensioned for receiving at least a portion of a die therein, and where an aperture may be formed in the recess extending through the substrate to a second side thereof for wire bonding the inner die to the substrate.

27 Claims, 9 Drawing Sheets

APPARATUS AND METHOD OF STACKING DIE ON A SUBSTRATE

CROSS-REFERENCE TO RELATED APPLICATION

This application is a continuation of pending united states patent application Ser. No. 08/995,377, filed Dec. 22, 1997 now abandoned.

TECHNICAL FIELD

The present invention relates to the packaging of microelectronic devices. More particularly, the invention relates the single level packaging of silicon wafer die on a substrate, such as a circuit board.

BACKGROUND OF THE INVENTION

Conventional fabrication of a microelectronics package involves two levels of packaging. With reference to FIG. 1, at the first level an integrated circuit die 20 is mounted to a lead frame 5, usually by an adhesive. Bonding pads 26 on the die are connected by bonding wires 28 to respective terminals 30 on the lead frame 5. The lead frame 5 and die 20 are then encapsulated by cover 7 to protect the die 20 and the bonding wires 28. The encapsulated lead frame and die thus constitute a first level of packaging. The encapsulated die and lead frame are mounted to a printed circuit board to create the second level of packaging. The lead frame may be mounted to the printed circuit board by way of solder reflow techniques or through the use of a socket mounted to the printed circuit board which is designed to receive the leads of the lead frame.

Recently, die have been mounted directly to the printed circuit board, thus eliminating the lead frame and the first level of packaging. Mounting directly to the circuit board decreases the length of the various electrical conductors such as leads and bonding wires, thus increasing the speed at which the chip can operate. FIG. 2 shows a conventional die 20 mounted directly to the circuit board 10 and secured thereto by suitable means such as by an adhesive. The die 20 has a set of bonding pads 26 which are located on one surface of the die 20. As shown in FIG. 2, the die 20 may be mounted with the bonding pads 26 of the die facing away from the surface of the circuit board 10 to which the die 20 is mounted. This type of arrangement is commonly referred to as conventional chip-on-board (COB).

FIG. 3 shows a die 20' mounted directly to a substrate, such as circuit board 10. The die 20' has a set of bonding pads 26' which are located on the bottom surface of the die 20'. As is shown in FIG. 3, the die 20' may be mounted with the bonding pads 26' of the die 20' facing the surface of a substrate such as the printed circuit board 10' to which the die 20' is being mounted. This type of arrangement is commonly referred to as flip chip. It is customary to provide a layer of material, known as a glob 46 top over the die 20' to hermetically seal the die 20'. The glob top 46 serves as a chemical insulator protecting the die 20' from humidity, oxidation and other harmful elements. The glob top 46 also protects the die 20' mechanically and relieves mechanical stress in the die 20'.

While recent changes in the fabrication of microelectronics packages have resulted in a decrease in package size, further decreases are desired. It is also desirable to shorten the bonding wire lengths used to electrically connect the die to the circuit board. Increased assembly yield and operational speed result from using shortened bonding wires. It is also desirable to minimize the thickness of the resulting microelectronics package. Package thickness is important in many space sensitive applications.

SUMMARY OF THE INVENTION

The invention of the present application stacks multiple die on top of one another. The stacked die may or may not be partially or fully recessed into a first recess formed in a first surface of a substrate, such as a circuit board. The first recess may have a stepped cross-section to accommodate die of various sizes.

An aperture may be formed in the first recess, extending through the substrate for allowing wire bonding to a second surface of the substrate. Thus, a first die which is spaced relatively interiorly of a second die may be wire bonded through the aperture to terminals located on the second surface of the substrate. The second die may be wire bonded to terminals located on the first surface of the substrate.

In another exemplary embodiment of the invention, a second recess is formed in the second surface of the substrate. The terminals are located within the recessed portion of the second surface.

Stacking multiple die on a single substrate will greatly increase the space available on the circuit board for the addition of other components. Mounting the die in a recess formed in the substrate will reduce the thickness of the resulting microelectronics package. Fabricating a set of terminals on a surface opposed to the surface on which the die is mounted can shorten the lengths of the bonding wires which connect the die to the substrate. Locating a set of terminals in a second recess formed in the second surface of the substrate will also reduce the thickness of the package and further shorten the length of the bonding wires.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with microelectronics packages and microelectronics packaging have not been shown in detail in order to avoid unnecessarily obscuring the description of the embodiments of the invention.

A first exemplary embodiment of the invention including a pair of lead-over-chip (LOC) die in a stacked arrangement will be discussed with reference to FIGS. 4–6.

Figure 1:
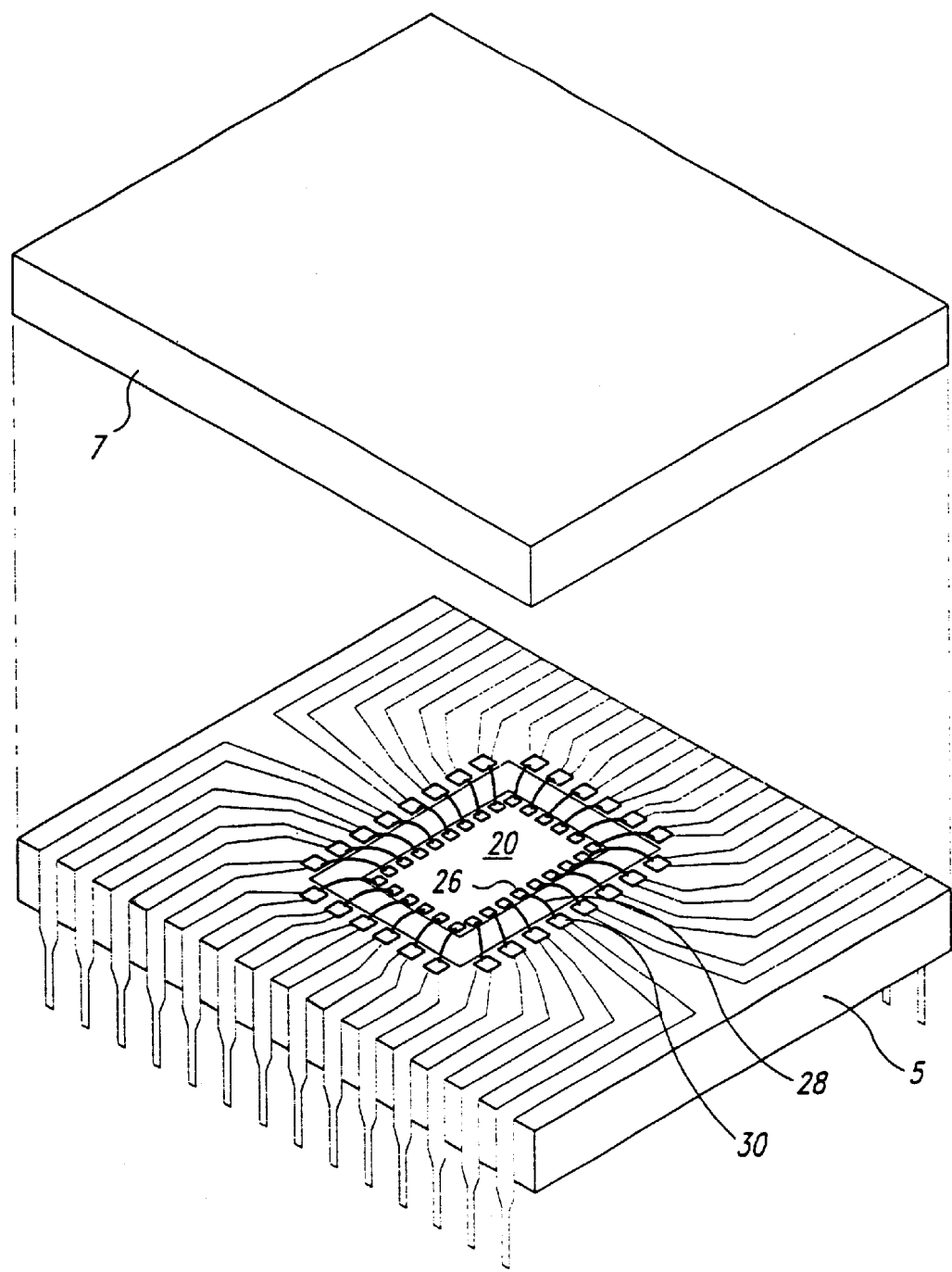
FIG. 1 is a perspective view of a die mounted in a lead frame in a conventional manner.
Figure 2:
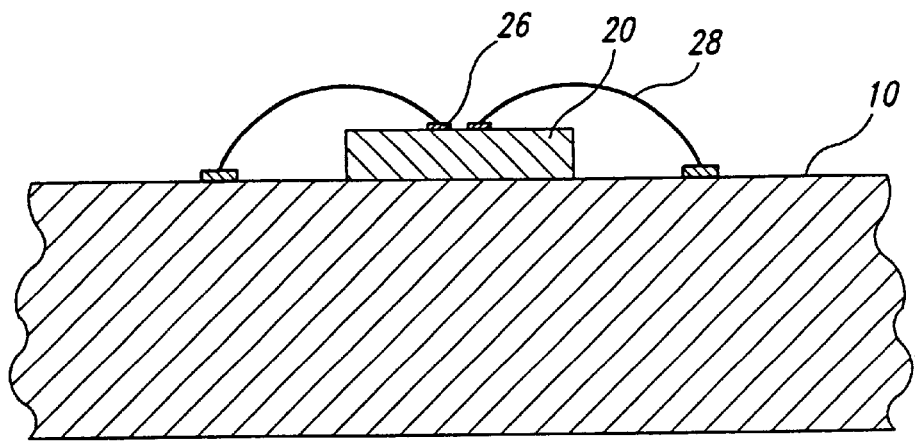
FIG. 2 is a cross-sectional view of a die mounted on a circuit board in a chip-on-board arrangement.
Figure 3:
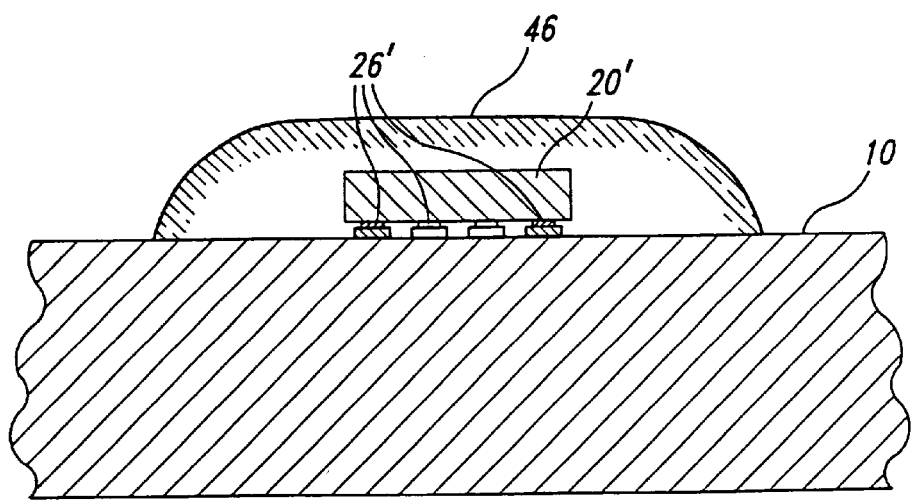
FIG. 3 is a conventional die mounted on a circuit board in a chip-on-board arrangement.
Figure 4:
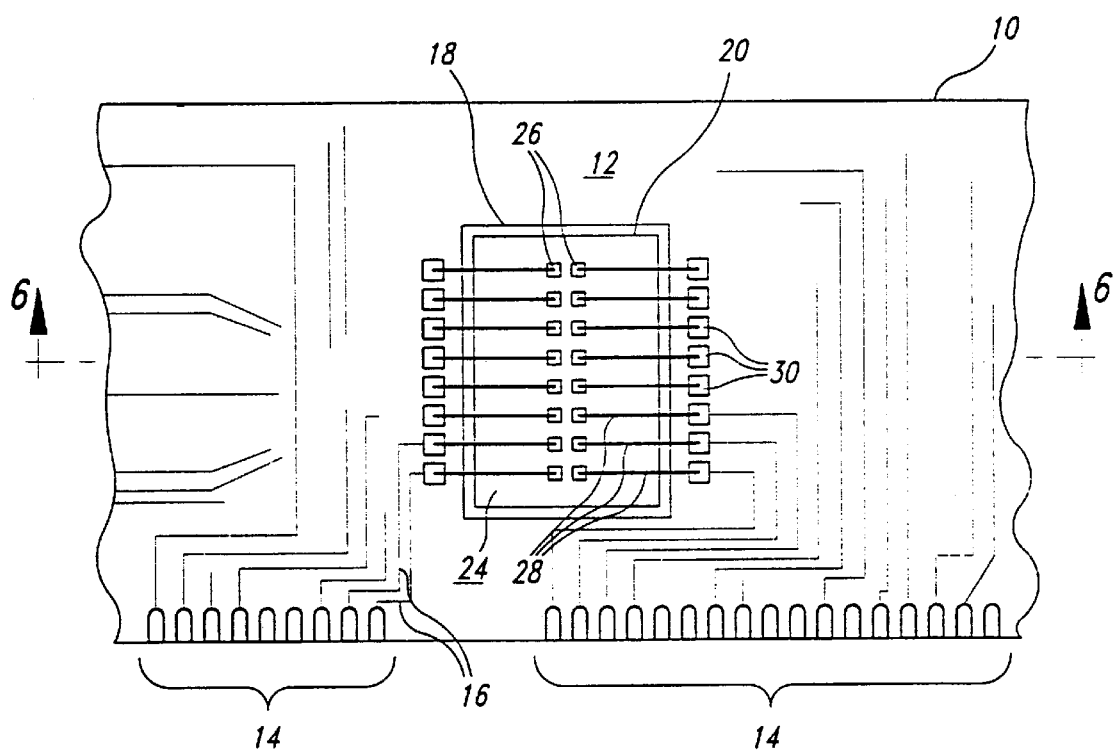
FIG. 4 is a top plan view of an exemplary embodiment of the invention.
Figure 6:
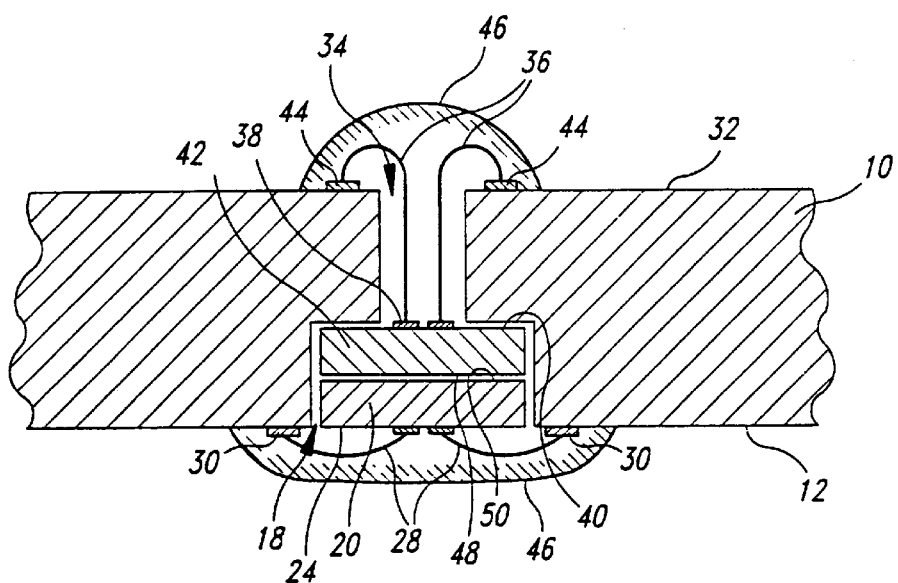
FIG. 6 is a cross-sectional view taken along section line 6 of the exemplary embodiment of FIG. 4.

With specific reference to FIGS. 4 and 6, a substrate is shown formed as a circuit board 10 having a first surface 12. A plurality of contacts 14 and conductive traces 16 are formed on the first surface 12 of the circuit board 10. The contacts 14 permit electrical connections to be made to other circuit leads. The conductive traces 16 provide electrical connections to various devices located on the circuit board 10. A recess 18 is formed in the first surface 12 of the circuit board 10. The recess 18 is dimensioned for receiving a pair of die in a stacked arrangement. A first or outer die 20 is shown mounted in the recess 18. The first die 20 has a bottom surface 24 which has a set of bonding pads 26 fabricated thereon. The term bonding pads as used in this specification, refers to any electrical contact formed on a microelectronic device by any method presently known or developed in the future. A set of bonding wires 28 electrically connect the bonding pads 26 to terminals 30 located on the first surface 12 of the circuit board 10.

Figure 5:
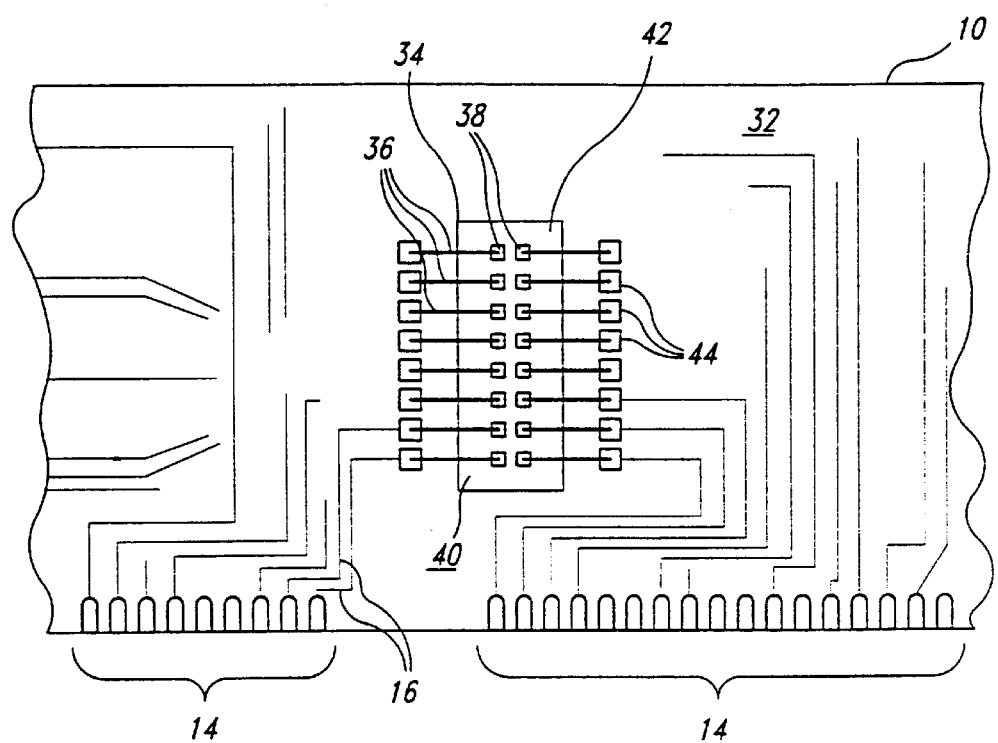
FIG. 5 is a bottom plan view of an exemplary embodiment of the invention wherein a pair of die are in stacked arrangement mounted fully-recessed in the circuit board.

With specific reference to FIG. 5, the circuit board 10 has a second surface 32 opposed to the first surface 12. An aperture 34 is formed in the first recess 18 and extends through the circuit board 10. The aperture 34 is dimensioned for receiving a set of bonding wires 36 therethrough. The bonding wires 36 electrically connect a set of bonding pads 38 formed on a bottom surface 40 of a second die 42 to a set of terminals 44 formed on the second surface 32 of the circuit board 10. The term terminals as used in this specification, refer to any electrical contact formed on a substrate by any method known or developed in the future.

With specific reference to FIG. 6, the first or outer die 20 is shown stacked on the second or inner die 42 such that a top surface 50 of the outer die 20 is adjacent a top surface 48 of the inner die 42. The outer die 20 and the inner die 42 may be secured to each other prior to being mounted in the first recess 18. Alternatively, the inner die 42 may be securely mounted in the recess 18, and then the outer die 20 may be securely fastened to the inner die 42. The outer and inner die 20, 42 may be fastened to each other or to the circuit board by way of an adhesive (not shown). Double sided non-conducting adhesive tape may be used for securing the die or conducting epoxy, non-conducting epoxy or solder paste may be used. Even where a layer of adhesive exists between the surfaces of the die, the die are considered adjacent within the meaning of the term adjacent as used herein.

Figure 7:
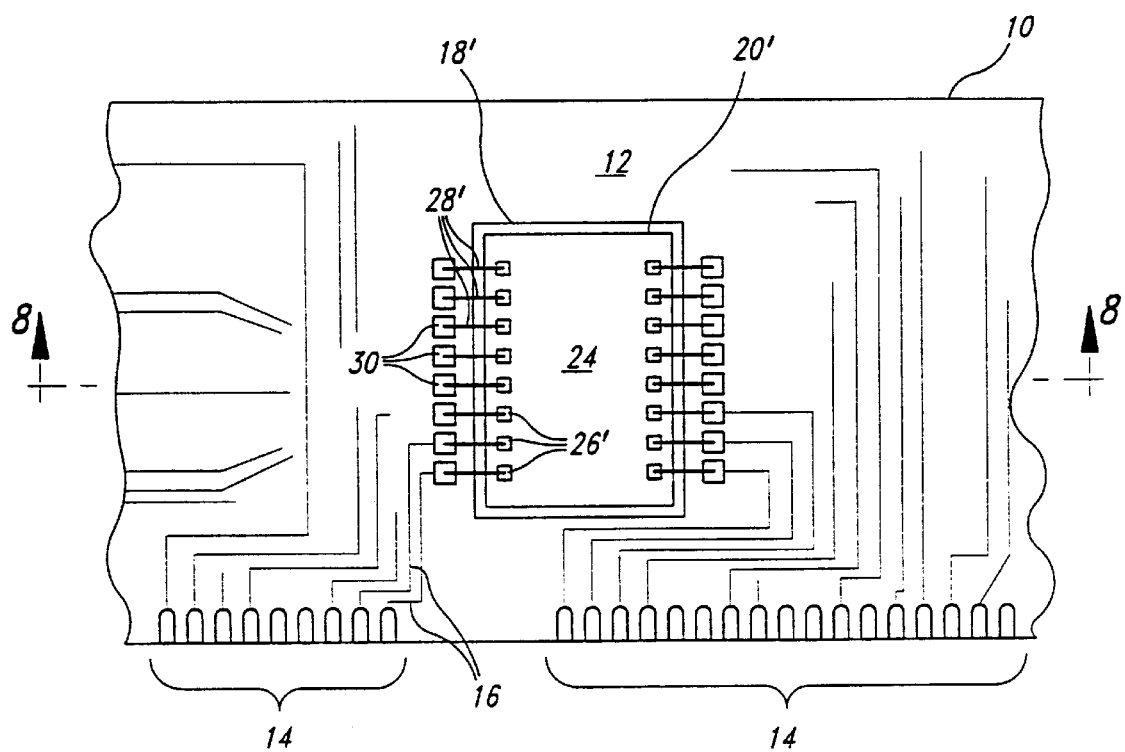
FIG. 7 is a bottom plan view of an exemplary embodiment of the invention wherein a lead-over-chip die is stacked interiorly of a conventional die.

An exemplary embodiment of the invention wherein a LOC die and conventional die are in stacked arrangement will be discussed with reference to FIGS. 7 and 8. In FIG. 7, an outer die 20', in the form of a conventional die, is shown mounted in the recess 18' that is dimensioned to receive a pair of die having different sizes. The conventional die 20' has a set of bonding pads 26' located on a bottom surface 24 of the die 20' and spaced about a periphery thereof. A set of bonding wires 28' are shown extending between bonding pads 26' and a set of terminals 30 located on the first surface 12 of the circuit board 10.

Figure 8:
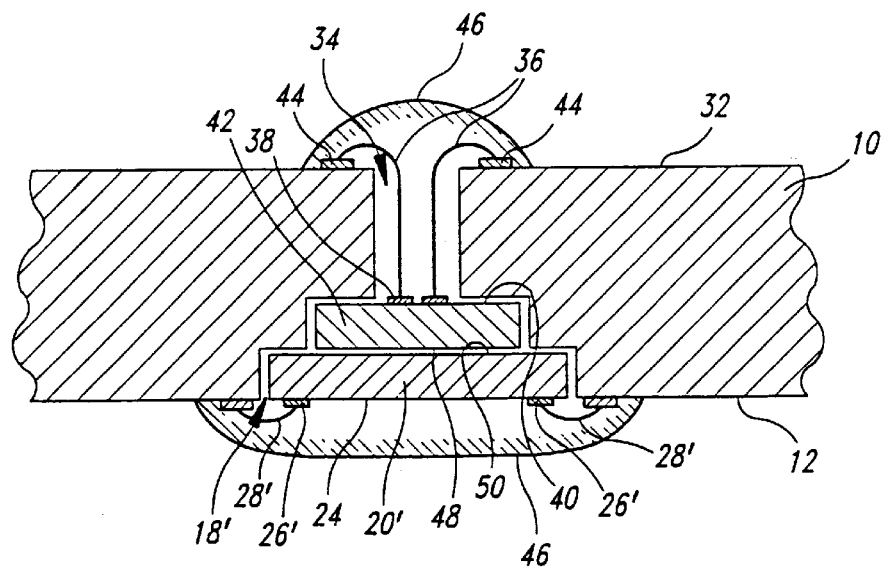
FIG. 8 is a cross-sectional view taken along section line 8 of the exemplary embodiment of FIG. 7.

With reference to FIG. 8, the first recess 18' is shown to have a stepped cross section. The first recess 18' is dimensioned to receive the smaller LOC die, inner die 42, in the inner portion of the stepped recess 18'. The first recess 18' is further dimensioned to receive the larger conventional die, outer die 20', in the outer portion of the stepped recess 18'. A set of bonding wires 36 electrically connect the inner die 42 to a set of terminals 44 located on the second surface 32 of the circuit board 10.

Figure 9:
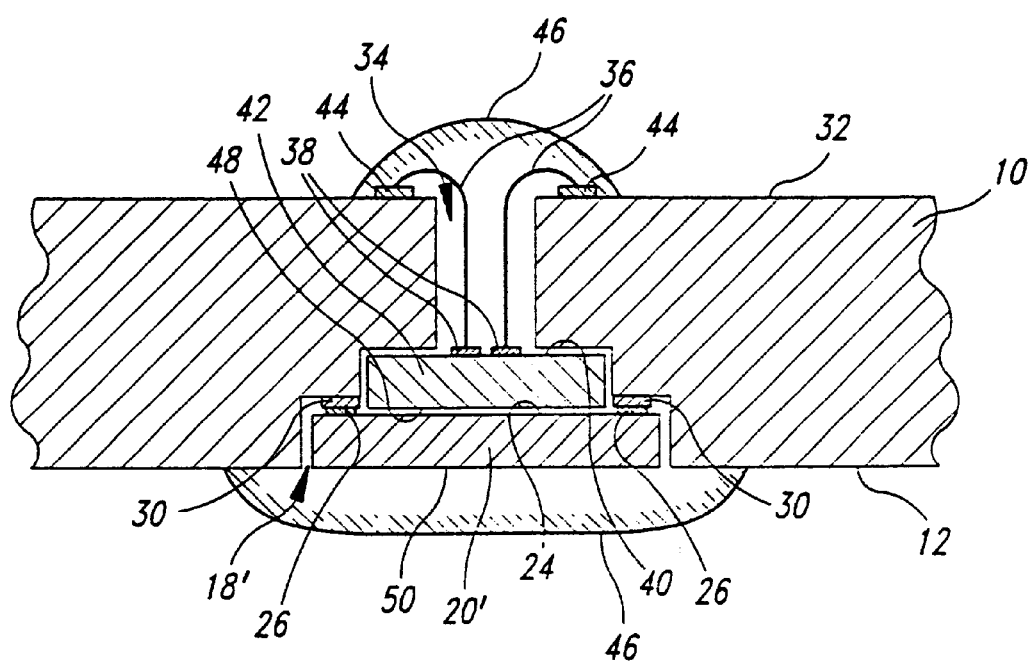
FIG. 9 is a cross-sectional view of an alternative exemplary embodiment of the invention wherein a lead-over-chip die is stacked interiorly of a conventional die which is mounted to the circuit board in a flip chip arrangement.

With reference to FIG. 9, in an alternative exemplary embodiment to that shown in FIGS. 7 and 8, the outer die 20' may be mounted in flip chip arrangement, the bonding pads 26 on the outer die 20' in direct contact with terminals 30 located in the stepped portion of the first recess 18'.

Figure 10:
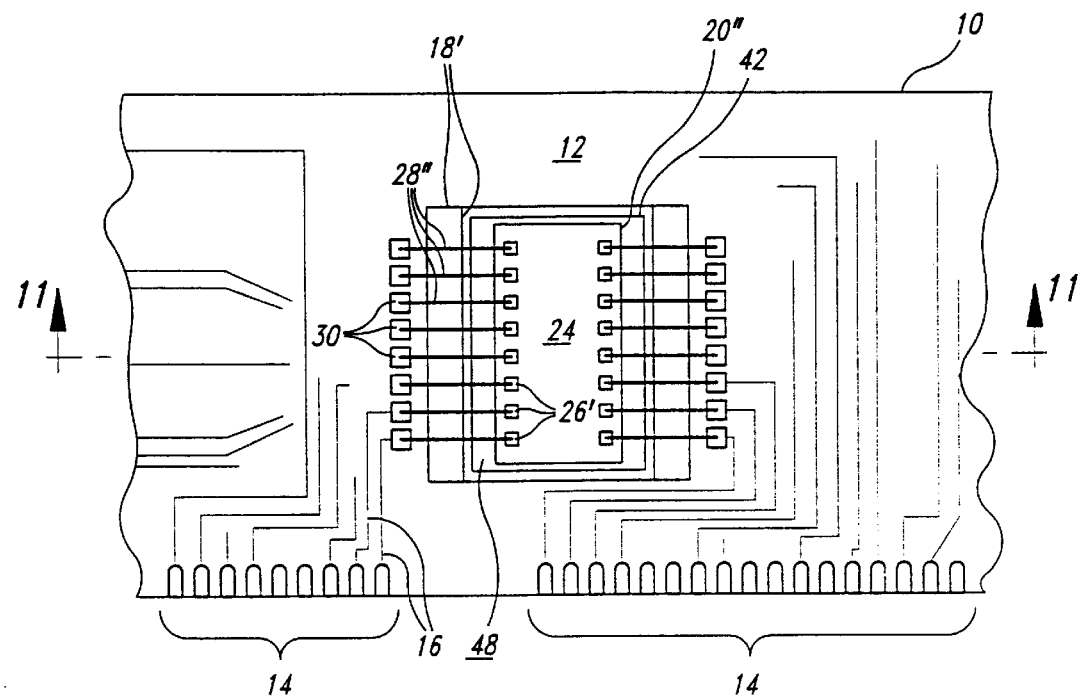
FIG. 10 is a bottom plan view of an exemplary embodiment of the present invention wherein a lead-over-chip die is stacked interiorly of an conventional die.
Figure 11:
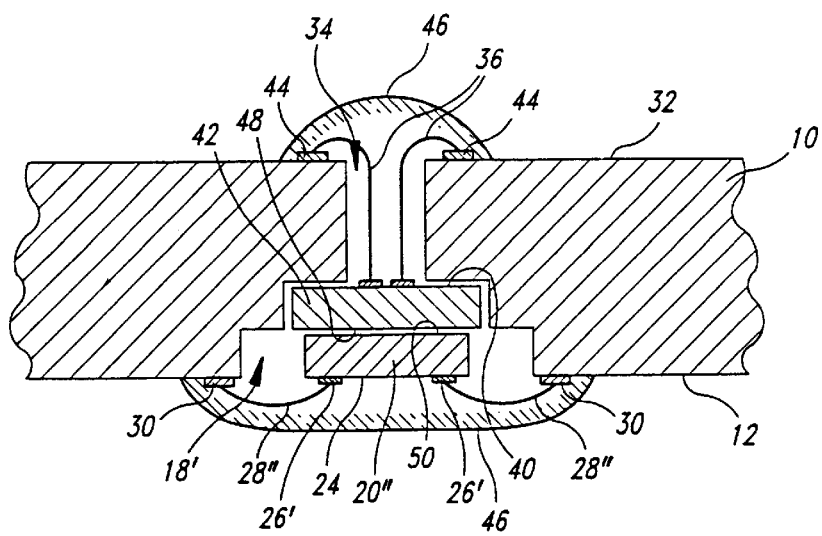
FIG. 11 is a cross-sectional view taken along section line 11 of the exemplary embodiment of FIG. 10.

An exemplary embodiment of the invention wherein a LOC die and a conventional die of a smaller size than the conventional die discussed immediately above will now be discussed with reference to FIGS. 10 and 11. The small conventional die serves as outer die 20" and is stacked on the relatively larger LOC die which serves as the inner die 42. The fabrication of this embodiment is very similar to that of the exemplary embodiment of FIGS. 7 and 8, however, the bonding wires 28" extending between the bonding pads 26' of the outer die 20" and the terminals 30 of the first surface 12 of the substrate, circuit board 10, are longer than the bonding wires 28' of the prior embodiment. It should be noted that the die do not need to completely fill the recess 18'. The glob top 46 will maintain the position of the die 20" in the recess 18', as well as, protect the die 20" from chemical, mechanical and electro-magnetic factors.

Figure 12:
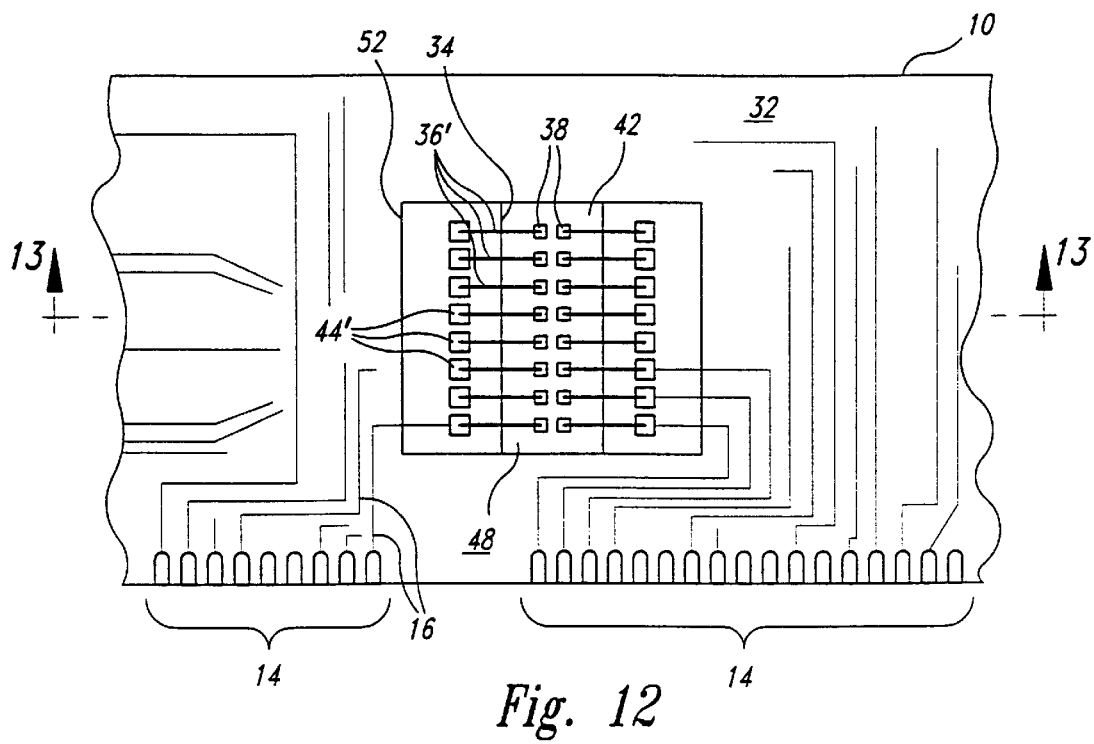
FIG. 12 is a top plan view of an exemplary embodiment of the invention wherein a recess is formed in the second surface of the circuit board and the terminals are located within the recess.
Figure 13:
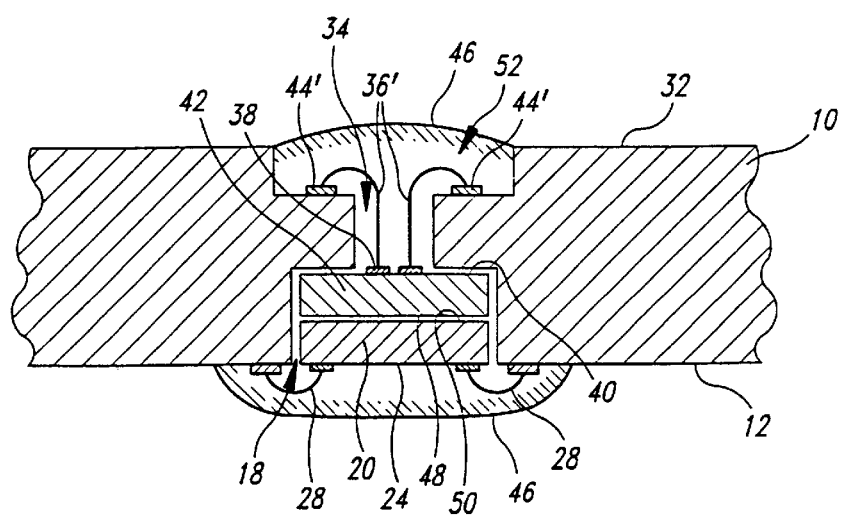
FIG. 13 is a cross-sectional view taken along section line 13 of the exemplary embodiment of FIG. 12.

A further exemplary embodiment is shown in FIGS. 12 and 13. Again a LOC die serves as the inner die 42. While a conventional die is shown as serving as the outer die 20, a second LOC die could be substituted for the conventional die. The second surface 32 of the circuit board 10 has a second recess 52 formed therein. The second recess 52 is dimensioned for receiving a set of terminals 44' and a set of bonding wires 36' therein. The terminals 44' are located within the second recess 52. The bonding wires 36' extend between the terminals 44' and the bonding pads 38 of the inner die 42. The loops of the bonding wires 36' are recessed with respect to the second surface 32 of the substrate, shown as circuit board 10. A glob top 46 is applied over the second recess 52.

Figure 14:
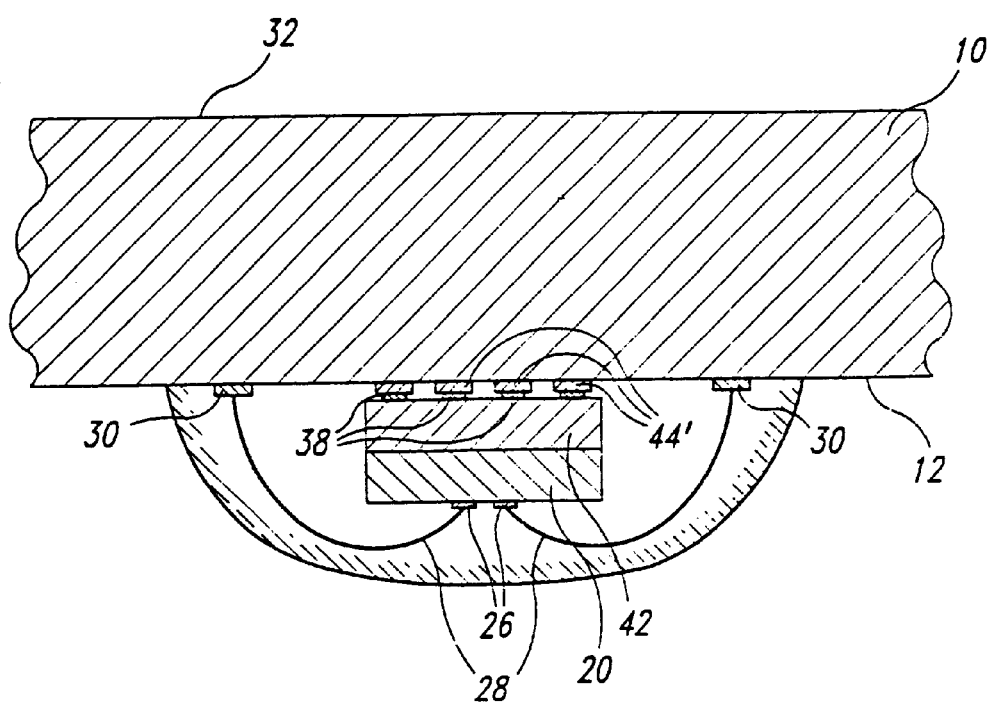
FIG. 14 is a cross-sectional view of an additional exemplary embodiment of the invention wherein the inner die is mounted on the surface of the circuit board in flip chip arrangement.

An additional exemplary embodiment is shown in FIG. 14. The inner die 42 is mounted in a flip chip arrangement on the circuit board 10 such that the bonding pads 38 of the inner die 42 are in direct contact with the terminals 44' located on the first surface 12 of the circuit board 10. The outer die 20 is mounted to the inner die 42, bonding wires 28 extending from the bonding pads 26 of the outer die 20 to a set of terminals 30 located on the first surface 12 of the circuit board 10.

It will be appreciated that, although embodiments of the invention have been described above for purposes of illustration, various modifications may be made without deviating from the spirit and scope of the invention. For example, the die do not have to be mounted flush with the substrate surface and may be either recessed from the surface of the substrate or extend partially above the surface, although flush or recess mounting will minimize the thickness of the resulting microelectronics package. Therefore, the particular geometry of the recess and aperture should not be construed to unduly limit the apparatus and methods which accomplish the purpose of mounting the die in stacked relation on the substrate. Those skilled in the art will also appreciate that the structure and method taught in accordance with the present invention can be applied to other geometry die and die arrangements. Indeed, numerous variations are well within the scope of the invention. Accordingly, the scope of the invention is not limited by the disclosure of particular embodiments, and terms used in the following claims should not be construed to limit the invention to these embodiments. Instead, the scope of the invention is determined entirely by the following claims.

What is claimed is:

1. A microelectronics package, comprising:
    a substrate having a first surface, a second surface opposed to the first surface, the first surface having a recess disposed therein, the substrate further having an aperture disposed therethrough and extending from the second surface to a bottom surface of the recess;
    an inner die having an inner surface, an outer surface opposed to the inner surface, and a set of bonding pads on the inner surface, the inner surface of the inner die being mounted to the bottom surface of the recess, the bonding pads on the inner surface of the inner die being coupled by a plurality of first electrical conductors with a first set of terminals located on the second surface of the substrate, the first electrical conductors passing through the aperture; and
    an outer die having a first surface coupled directly to the outer surface of the inner die, a second surface substantially opposite from the first surface, and a set of second bonding pads disposed on the second surface, the outer die being stacked on the inner die to form a stack on a same side of the substrate, the plurality of second bonding pads on the second surface of the second die being coupled through a plurality of second electrical conductors with a second set of terminals located on the substrate.

2. The microelectronics package of claim 1 wherein the recess is sized to substantially receive the inner die.

3. The microelectronics package of claim 1 wherein the second set of terminals is disposed within the recess.

4. The microelectronics package of claim 1 wherein second surface of the outer die being flush with the first surface of the substrate.

5. The microelectronics package of claim 1 wherein:
    the inner die and outer die are different dimensions.

6. The microelectronics package of claim 1 wherein:
    the inner die is a lead-over-chip die and outer die is a lead-over-chip die.

7. The microelectronics package of claim 1 wherein:
    the inner die is a lead-over-chip die and outer die is a conventional die.

8. The microelectronics package of claim 1 wherein:
    the inner die is a lead-over-chip die and outer die is a conventional die having a width and a length which is less than a width and a length of the inner die.

9. A fabrication structure for use in the fabrication of microelectronics packages, the fabrication structure comprising:
    a substrate having a first surface, a second surface opposed to the first surface, and a first recess formed in the first surface, the first recess having a bottom surface;
    an inner die having a first surface, a second surface opposed to the first surface, and a set of bonding pads on the first surface, the inner die being attached to the bottom surface of the first recess and at least partially contained within the first recess with the first surface of the inner die adjacent to the bottom surface of the first recess, and the bonding pads on the first surface being coupled to a first set of terminals on the bottom surface of the first recess; and
    an outer die attached directly to the inner die to form a stack, the outer die including a first surface attached directly to the second surface of the inner die, a second surface opposed to the first surface, and a set of bonding pads on the second surface of the outer die, the set of bonding pads on the second surface being coupled to a second set of terminals on the substrate.

10. The fabrication structure of claim 9 wherein:
    the first recess has a depth, the depth of the first recess being dimensioned to receive the stack such that the stack is substantially flush with the first surface of the substrate.

11. The fabrication structure of claim 9 wherein the set of bonding pads on the second surface of the outer die are coupled to the second terminals on the substrate by a plurality of bonding wires.

12. The fabrication structure of claim 9, further comprising:
    an aperture formed in the first recess, the aperture extending through the substrate from the second surface of the substrate to the bottom surface of the first recess, the aperture dimensioned to receive a plurality of bonding wires therethrough;
    a third set of bond pads on the first surface of the inner die; and
    a third set of terminals on the second surface of the substrate, the third set of bond pads being coupled to the third set of terminals by a set of bonding wires extending through the aperture.

13. The fabrication structure of claim 9 wherein the set of bonding pads on the second surface of the outer die are in direct contact with the second terminals on the substrate.

14. The fabrication structure of claim 13 wherein the second terminals are located within the recess, and wherein the outer die is at least partially disposed within the recess.

15. A method of forming a microelectronics package, comprising:
    supplying a substrate having a first surface with a recess disposed therein, a second surface opposed the first surface, and an aperture disposed through the substrate and extending from the second surface to a bottom surface of the recess;
    mounting an inner die to the bottom surface of the recess proximate the aperture;
    mounting an outer die directly to an outer surface of the inner die substantially opposite from the bottom surface of the recess to form a die stack at least partially disposed within the recess; and
    electrically coupling the inner die and the outer die to first and second terminals located on the substrate, respectively, the inner die being coupled to the first terminals by a plurality of electrical conductors passing through the aperture.

16. The method of claim 15, wherein
the step of mounting the inner die to the substrate is performed before the step mounting the outer die to the inner die.

17. The method of claim 15, wherein
the step of mounting the outer die to the inner die is performed before the step of mounting the inner die to the substrate.

18. A method of forming a microelectronics package, comprising:
supplying a substrate having a first surface and a second surface opposed to the first surface;
forming a first recess in the first surface of the substrate, the first recess having a bottom surface and being dimensioned for receiving at least a portion of a die stack including an inner die and an outer die attached directly to the inner die;
forming an aperture within the first recess that extends through the substrate from the second surface of the substrate to the bottom surface of the first recess;
positioning the die stack at least partially within the recess;
attaching the inner die to the bottom surface of the first recess; and
connecting a set of bond pads on the inner die to a set of terminals on the second surface of the substrate by a plurality of bond wires extending through the aperture.

19. The method of claim 18, further comprising the steps of:
fabricating a set of terminals in the first recess;
attaching the inner die to the bottom surface of the first recess such that a set of bonding pads on the inner die are in electrical contact with the set of terminals;
mounting the outer die on the inner die after mounting the inner die in the first recess;
fabricating a plurality of terminals on the first surface of the substrate; and
connecting a set of bonding pads located on the outer die to the set of terminals fabricated on the first surface of the substrate with a set of bonding wires.

20. The method of claim 17, further comprising the steps of:
fabricating a set of terminals in the first recess;
attaching the inner die to the bottom surface of the first recess such that a set of bonding pads on the inner die are in electrical contact with the set of terminals fabricated in the first recess;
mounting the outer die on the inner die before mounting the inner die in the first recess of the substrate;
fabricating a set of terminals on the first surface of the substrate; and
connecting a set of bonding pads located on the outer die to the set of terminals fabricated on the first surface of the substrate with a set of bonding wires.

21. The method of claim 18, further comprising:
mounting the outer die on the inner die before mounting the inner die in the first recess; and
electrically connecting a set of bonding pads located on the outer die to a plurality of terminals on the first surface of the substrate.

22. The method of claim 18, further comprising defining a second recess in the second surface of the substrate, the second recess providing communication with the aperture and dimensioned for receiving at least one terminal therein.

23. The method of claim 22, further comprising the steps of:
fabricating a set of terminals in the second recess in the second surface of the substrate;
attaching the inner die to the bottom surface of the first recess;
connecting a set of bonding pads located on the inner die to the set of terminals fabricated in the second recess with a set of bonding wires passing through the aperture;
mounting the outer die to the inner die after mounting the inner die in the first recess;
fabricating a set of terminals on the first surface of the substrate; and
connecting a set of bonding pads located on the outer die to the set of terminals fabricated on the first surface of the substrate.

24. The method of claim 22, further comprising the steps of:
fabricating a set of terminals in the second recess in the second surface of the substrate;
attaching the inner die to the bottom surface of the first recess;
connecting a set of bonding pads located on the inner die to the set of terminals fabricated in the second recess with a set of bonding wires passing through the aperture of the substrate;
mounting the outer die to the inner die before mounting the inner die in the first recess;
connecting a set of bonding pads located on the outer die to the set of terminals fabricated on the first surface of the substrate.

25. A method of forming a microelectronics package comprising:
supplying a substrate having a first surface including a recess disposed therein, and a second surface opposed to the first surface;
mounting an inner die on the substrate, the inner die having a first surface attached to a bottom surface of the recess, a second surface opposite the first surface, and a set of bonding pads on the first surface connected to a first set of terminals on the substrate; and
mounting an outer die on the inner die, the outer die having a first surface coupled directly to the second surface of the inner die, a second surface opposite the first surface, and a set of bonding pads on the second surface connected to a second set of terminals on the first surface of the substrate.

26. The method of claim 25 wherein the first set of terminals are formed in the recess, at least a portion of the inner die being disposed within the recess with the set of bonding pads on the first surface of the inner die connected to the first set of terminals.

27. The method of claim 25 wherein the first set of terminals is disposed on the second surface of the substrate, further comprising:
forming an aperture extending through the substrate from the second surface to the bottom surface of the recess; and
connecting the set of bonding pads on the first surface of the inner die to the first set of terminals on the second surface by electrical conductors extending through the aperture.

* * * * *